United States Patent
Ohtaki et al.

(10) Patent No.: US 6,892,333 B2
(45) Date of Patent: May 10, 2005

(54) IC MEASURING DEVICE

(75) Inventors: Toshiyuki Ohtaki, Tokyo (JP); Mitsuru Kondo, Tokyo (JP)

(73) Assignee: Ando Electric Co., Ltd., Tokyo (JP)

( * ) Notice: Subject to any disclaimer, the term of this patent is extended or adjusted under 35 U.S.C. 154(b) by 460 days.

(21) Appl. No.: 10/033,252

(22) Filed: Dec. 26, 2001

(65) Prior Publication Data

US 2002/0079917 A1 Jun. 27, 2002

(30) Foreign Application Priority Data

Dec. 27, 2000 (JP) .................................... P2000-397454

(51) Int. Cl.⁷ ............................................. G11B 20/20
(52) U.S. Cl. ...................................................... 714/700
(58) Field of Search ................................ 714/700, 701, 714/718, 724, 731, 775, 738; 365/201; 324/765

(56) References Cited

U.S. PATENT DOCUMENTS 5,835,506 A * 11/1998 Kuglin ........................ 714/738
6,016,565 A    1/2000 Miura ......................... 714/736

FOREIGN PATENT DOCUMENTS

DE         101 01 899 A1    11/2001

* cited by examiner

*Primary Examiner*—Guy J. Lamarre
*Assistant Examiner*—James C. Kerveros
(74) *Attorney, Agent, or Firm*—Fish & Richardson P.C.

(57) ABSTRACT

An IC measuring device constituted by a first timing generator (TG21) for outputting a pair of judgment strobe pulses (S21); a first edge detector (E21) for detecting the states of a data strobe (DCK2) at two time points within one test cycle on the basis of the pair of judgment strobe pulses (S21); a second timing generator (TG22) for outputting a pair of judgment strobe pulses (S22); a second edge detector (E22) for detecting the states of data at two time points within one test cycle on the basis of the pair of judgment strobe pulses (S22); and a judgment section (J22) for determining acceptance/rejection of the timing of the data with reference to the data strobe on the basis of the states of the data and the states of the data strobe.

5 Claims, 6 Drawing Sheets

| | | FAIL (H) | | | | | | FAIL (H) | | | | | | PASS (L) | | | | | |
|---|---|---|---|---|---|---|---|---|---|---|---|---|---|---|---|---|---|---|---|
| INPUT | EDGE JUDGMENT RESULT R21-1 | | | | | | | | | | | | | | | | | | |
| | EDGE JUDGMENT RESULT R21-2 | FAIL (H) | | | | PASS (L) | | FAIL (H) | | | | PASS (L) | | FAIL (H) | | | | PASS (L) | |
| | EDGE JUDGMENT RESULT R22-1 | FAIL (H) | FAIL (H) | PASS (L) | PASS (L) | FAIL (H) | PASS (L) | FAIL (H) | FAIL (H) | PASS (L) | PASS (L) | FAIL (H) | PASS (L) | FAIL (H) | FAIL (H) | PASS (L) | PASS (L) | FAIL (H) | PASS (L) |
| | EDGE JUDGMENT RESULT R22-2 | FAIL (H) | PASS (L) | FAIL (H) | PASS (L) | | | FAIL (H) | PASS (L) | FAIL (H) | PASS (L) | FAIL (H) | PASS (L) | FAIL (H) | PASS (L) | FAIL (H) | PASS (L) | | |
| OUTPUT | PASS/FAIL JUDGMENT P22 | PASS (L) | | | | | | FAIL (H) | | | | | | PASS (L) | | | | | |

| | PERIOD A | | PERIOD B | |
|---|---|---|---|---|
| | D21 | D22 | D21 | D22 |
| DCK2 EDGE JUDGMENT RESULT | FAIL (H) | PASS (L) | FAIL (H) | FAIL (H) |
| D21 AND D22 EDGE JUDGMENT RESULT | FAIL (H) | FAIL (H) | PASS (L) | PASS (L) |
| | PASS (L) | FAIL (H) | PASS (L) | PASS (L) |
| PASS/FAIL JUDGMENT | PASS (L) | FAIL (H) | PASS (L) | PASS (L) |

FIG. 5

IC MEASURING DEVICE

BACKGROUND OF THE INVENTION

1. Field of the Invention

The present invention relates to an IC measuring device for testing an IC (particularly an IC containing data strobe).

2. Description of the Related Art

Figure 5:
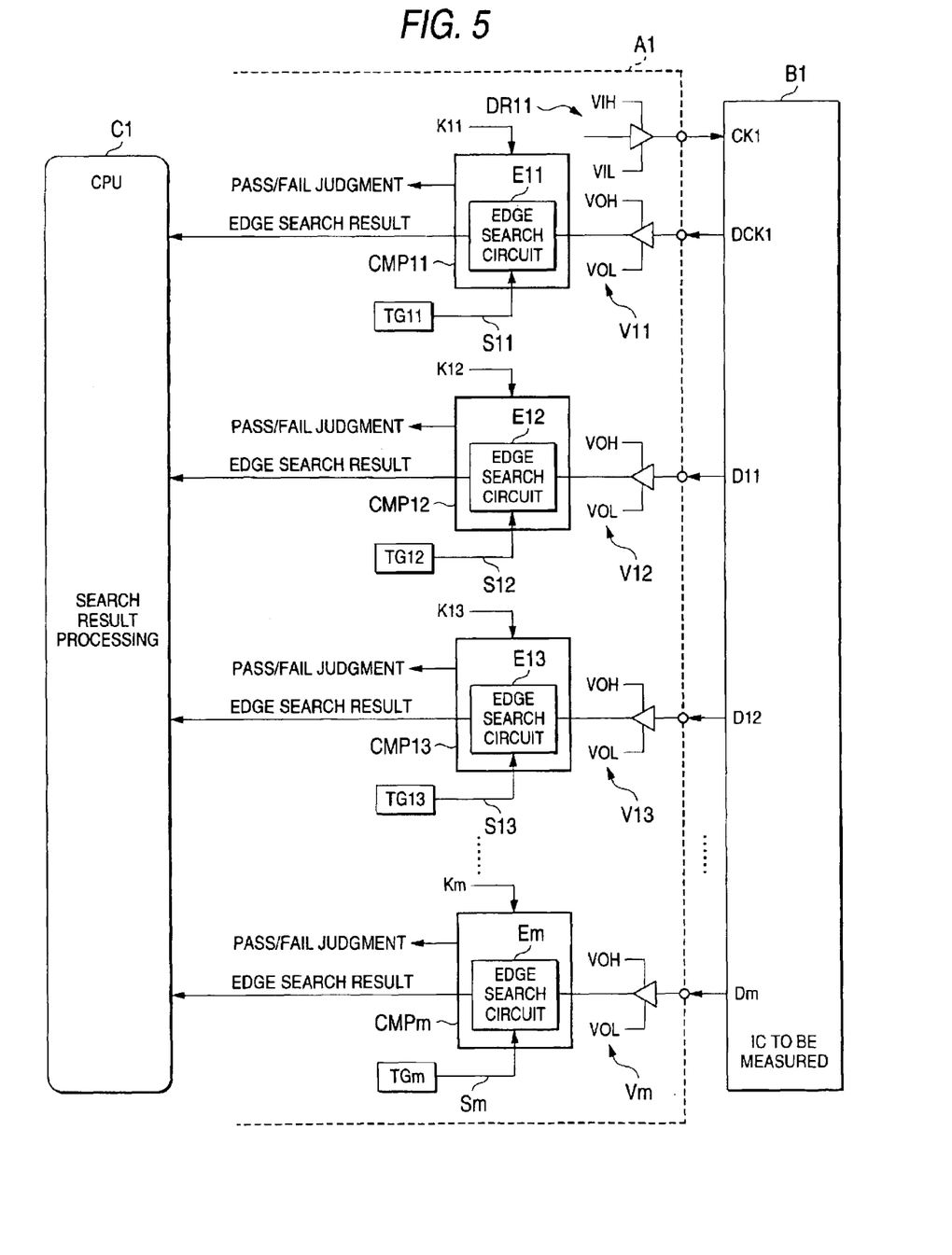
FIG. 5 is a block diagram showing the configuration of a background-art IC measuring device.
Figure 6:
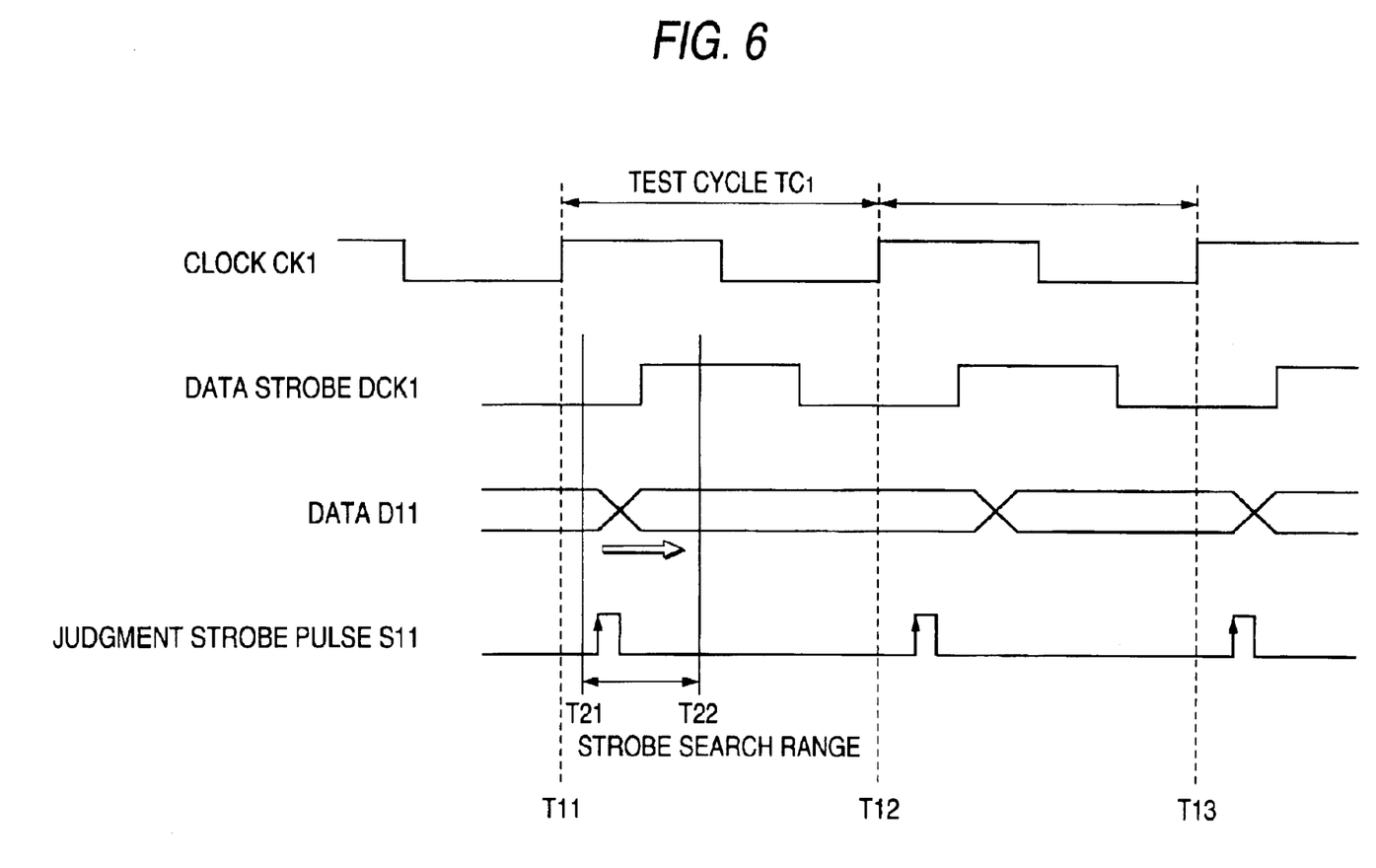
FIG. 6 is a timing chart showing the operation of the background-art IC measuring device.

FIG. 5 is a block diagram showing the configuration of a background-art IC measuring device. FIG. 6 is a timing chart showing the operation of the IC measuring device. First, an IC measuring device (A1) supplies a clock (CK1) to an IC (B1) to be measured. Thus, the IC (B1) to be measured is operated in synchronism with a test cycle (TC1) having a period corresponding to the clock (CK1).

The output timing at which a data strobe (DCK1) is outputted from the IC (B1) to be measured is supplied to an edge search circuit (E11) in a logic comparator (CMP11) through a voltage comparator (V11) in the IC measuring device (A1). The edge search circuit (E11) latches the data strobe (DCK1) at the timing of a judgment strobe pulse (S11) outputted from a timing generator (TG11). The timing of the edge of the judgment strobe pulse (S11) outputted from the timing generator (TG11) is varied n times every test cycle (TC1) within a range of from a time point T21 to a time point T22. That is, time corresponding to n cycles of the test cycle (TC1) is required for varying the timing n times.

The logic comparator (CMP11) latches the state of the data strobe (DCK1) at the timing of the edge of the judgment strobe pulse (S11), and compares the state of the data strobe (DCK1) with an expected value (K11). That is, the state of the data strobe (DCK1) is latched and compared with the expected value (K11) while the timing of the edge of the judgment strobe pulse (S11) is varied n times. Thus, the timing at which the edge of the data strobe (DCK1) is outputted is detected, that is, an interval between a time point T11 when the leading edge of the clock (CK1) is outputted and a time point when the edge of the data strobe (DCK1) is outputted is detected.

Similarly, while the timing of the edge of a judgment strobe (S12) is varied, the timing at which the edge of data (D11) is outputted is detected, that is, an interval between the time point T11 when the leading edge of the clock (CK1) is outputted and a time point when the edge of the data (D11) is outputted is detected.

Then, a difference between the two intervals is obtained, and PASS/FAIL of the measured IC (B11) is judged.

In the above-mentioned background art, the operation of latching the state of the data strobe (DCK1) at the timing of the edge of the judgment strobe pulse (S11) and comparing the state of the data strobe (DCK1) with the expected value (K11) is required to be repeated n times so as to detect the timing at which the edge of the data strobe (DCK1) is outputted.

Similarly, the operation of latching the state of the data (D11) at the timing of the edge of the judgment strobe pulse (S12) and comparing the state of the data (D11) with an expected value (K12) must be repeated n times so as to detect the timing at which the edge of the data (D1) is outputted.

Further, if data outputted from the IC (B1) to be measured do not include only the data (D11) but include a plurality of data, for example, data (D11), data (D12), . . . , the above-mentioned comparison operation repeated n times must be repeated in accordance with the number of data in order to detect the respective timings of the data. That is, when the number of data is k, the above-mentioned operation of latch and comparison must be repeated k×n times.

That is, in the above-mentioned background art, there is a problem that it takes much time to measure the timing at which the IC (B1) to be measured outputs data (a data strobe or data) to be measured.

In addition, in the background art, when the data strobe (DCK1) or the data (D11) varies in each test cycle (TC1), conclusion can be drawn only when the data strobe (DCK1) or the data (D11) is the slowest, and conclusion cannot be drawn for each test cycle.

SUMMARY OF THE INVENTION

The present invention has been developed to solve the foregoing problems. An object of the present invention is to provide an IC measuring device in which it does not take much time to measure the timing at which an IC (B1) to be measured outputs data (a data strobe or data) to be measured.

According to an aspect of the present invention, there is provided an IC measuring device for determining acceptance/rejection of timing between a data strobe and data outputted from an IC to be measured, constituted by: a first timing generator for outputting a pair of judgment strobe pulses different in time point but in synchronism with a test cycle of the IC measuring device; a first edge detector for detecting states of the data strobe at two time points within one test cycle on the basis of the pair of judgment strobe pulses different in time point and supplied by the first timing generator; a second timing generator for outputting a pair of judgment strobe pulses different in time point but in synchronism with a test cycle of the IC measuring device; a second edge detector for detecting states of the data at two time points within one test cycle on the basis of the pair of judgment strobe pulses different in time point and supplied by the second timing generator; and a judgment section for determining acceptance/rejection of timing of the data with reference to the data strobe on the basis of the states of the data detected by the second edge detector and the states of the data strobe detected by the first edge detector.

According to another aspect of the present invention, a time interval between the pair of judgment strobe pulses outputted from the first timing generator and a time interval between the pair of judgment strobe pulses outputted by the second timing generator are set respectively in accordance with standards of the IC to be measured.

According to a further aspect of the present invention, a relationship in accordance with the standards of the IC to be measured is established between timing at which the first timing generator outputs each of the judgment strobe pulses and timing at which the second timing generator outputs corresponding one of the judgment strobe pulses.

According to a still further aspect of the present invention, the IC measuring device includes: a plurality of circuit blocks each including the second timing generator, the second edge detector and the judgment section.

According to another aspect of the present invention, a relationship in accordance with the standards of the IC to be measured is established among judgment strobe pulses outputted from the second timing generators included in the circuit blocks.

According to the present invention, when a pair of judgment strobe pulses are outputted from the timing generator, the states of data (a data strobe or data) to be measured are detected at two timings.

DETAILED DESCRIPTION OF THE PRESENT INVENTION

Figure 1:
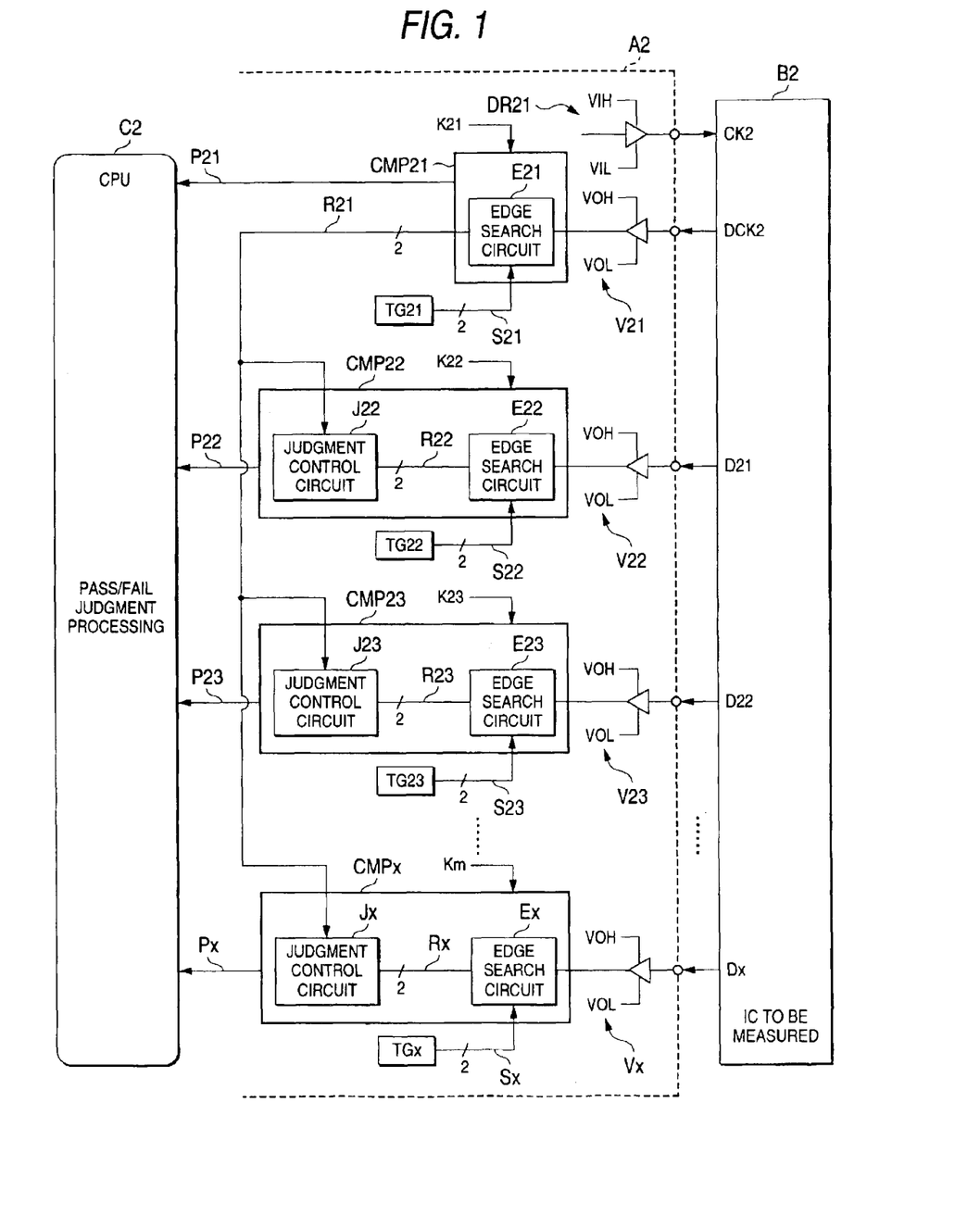
FIG. 1 is a block diagram showing the configuration of an IC measuring device (A2) according to an embodiment of the present invention.

FIG. 1 is a block diagram showing the configuration of an IC measuring device (A2) according to an embodiment of the present invention. When the IC measuring device (A2) sends a clock (CK2) to an IC (B2) to be measured, the IC (B2) to be measured outputs a data strobe (DCK2), data (D21), data (D22), . . . , and data (Dx). The data strobe (DCK2), the data (D21), the data (D22), . . . , and the data (Dx) outputted from the IC (B2) to be measured are supplied to the IC measuring device (A2) again.

The data strobe (DCK2) outputted from the IC (B2) to be measured is supplied to an edge search circuit (E21) in a logic comparator (CMP21) through a voltage comparator (V21) in the IC measuring device (A2). Two systems of judgment strobe pulses (S21) outputted from a timing generator (TG21) are also supplied to the edge search circuit (E21). That is, the judgment strobe pulses (S21) are constituted by two systems of judgment strobe pulse (S21-1) and judgment strobe pulse (S21-2). Then, the edge search circuit (E21) outputs a two-bit edge judgment result (R21) That is, the edge judgment result (R21) is constituted by an edge judgment result (R21-1) and an edge judgment result (R21-2).

The data (D21) outputted from the IC (B2) to be measured is supplied to an edge search circuit (E22) in a logic comparator (CMP22) through a voltage comparator (V22) in the IC measuring device (A2). Two systems of judgment strobe pulses (S22) outputted from a timing generator (TG22) are also supplied to the edge search circuit (E22). That is, the judgment strobe pulses (S22) are constituted by two systems of judgment strobe pulse (S22-1) and judgment strobe pulse (S22-2). Then, the edge search circuit (E22) outputs a two-bit edge judgment result (R22) That is, the edge judgment result (R22) is constituted by an edge judgment result (R22-1) and an edge judgment result (R22-2).

The edge judgment result (R22) is supplied to a judgment control circuit (J22). The edge judgment result (R21) is also supplied to the judgment control circuit (J22). Then, the judgment control circuit (J22) outputs a Pass/Fail judgment (P22) The outputted Pass/Fail judgment (P22) is supplied to a CPU (C2).

The data (D22) outputted from the IC (B2) to be measured is supplied to an edge search circuit (E23) in a logic comparator (CMP23) through a voltage comparator (V23) in the IC measuring device (A2). Two systems of judgment strobe pulses (S23) outputted from a timing generator (TG23) are also supplied to the edge search circuit (E23). That is, the judgment strobe pulses (S23) are constituted by two systems of judgment strobe pulse (S23-1) and judgment strobe pulse (S23-2). Then, the edge search circuit (E23) outputs a two-bit edge judgment result (R23). That is, the edge judgment result (R23) is constituted by an edge judgment result (R23-1) and an edge judgment result (R23-2).

The edge judgment result (R23) is supplied to a judgment control circuit (J23). The edge judgment result (R21) is also supplied to the judgment control circuit (J23). Then, the judgment control circuit (J23) outputs a Pass/Fail judgment (P23). The outputted Pass/Fail judgment (P23) is supplied to a CPU (C2).

The same rule applies to the data (D23, D24, . . . , Dx) outputted from the IC (B2) to be measured.

Figure 2:
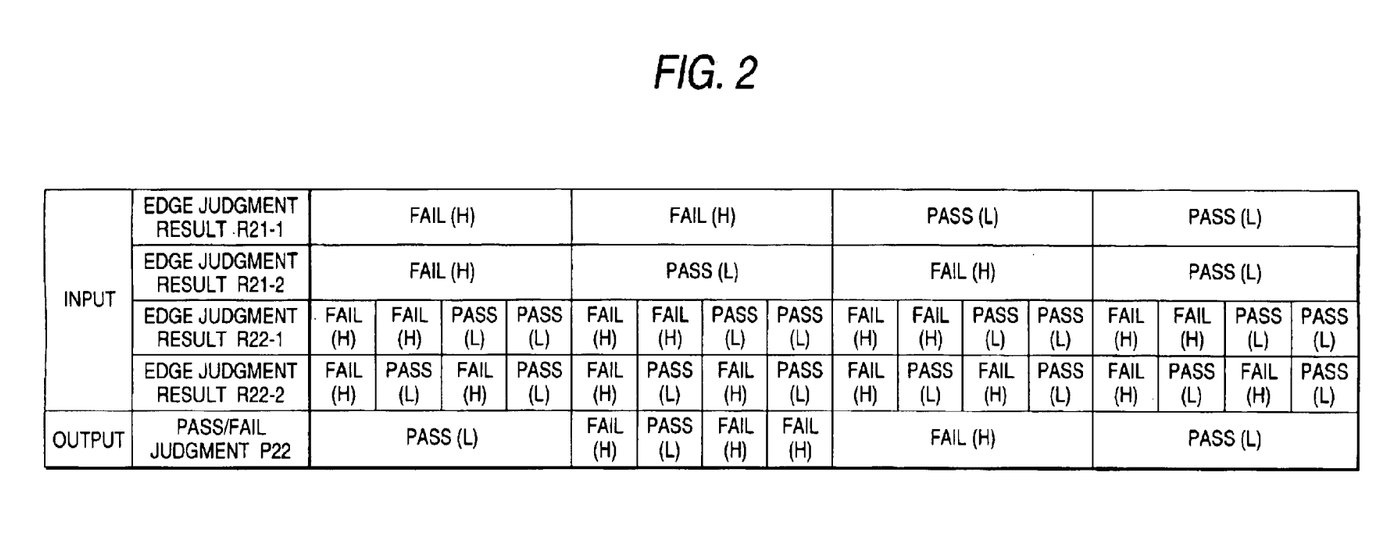
FIG. 2 is a table showing the relationship between input and output in a judgment control circuit (J22).

FIG. 2 is a table showing the relationship between input and output in the judgment control circuit (J22). Incidentally, the same rule applies to the relationships between input and output in the judgment control circuits (J23, J24, . . . , Jx).

The judgment control circuit (J22) receives the edge judgment results (R21-1 and R21-2) of the data strobe (DCK2) and the edge judgment results (R22-1 and R22-2) of the data (D21), and outputs the Pass/Fail judgment (P22). For example, when the edge judgment result (R21-1) is H, the edge judgment result (R21-2) is L, the edge judgment result (R22-1) is H, and the edge judgment result (R22-2) is H, the Pass/Fail judgment (P22) becomes Fail (H).

Figure 3:
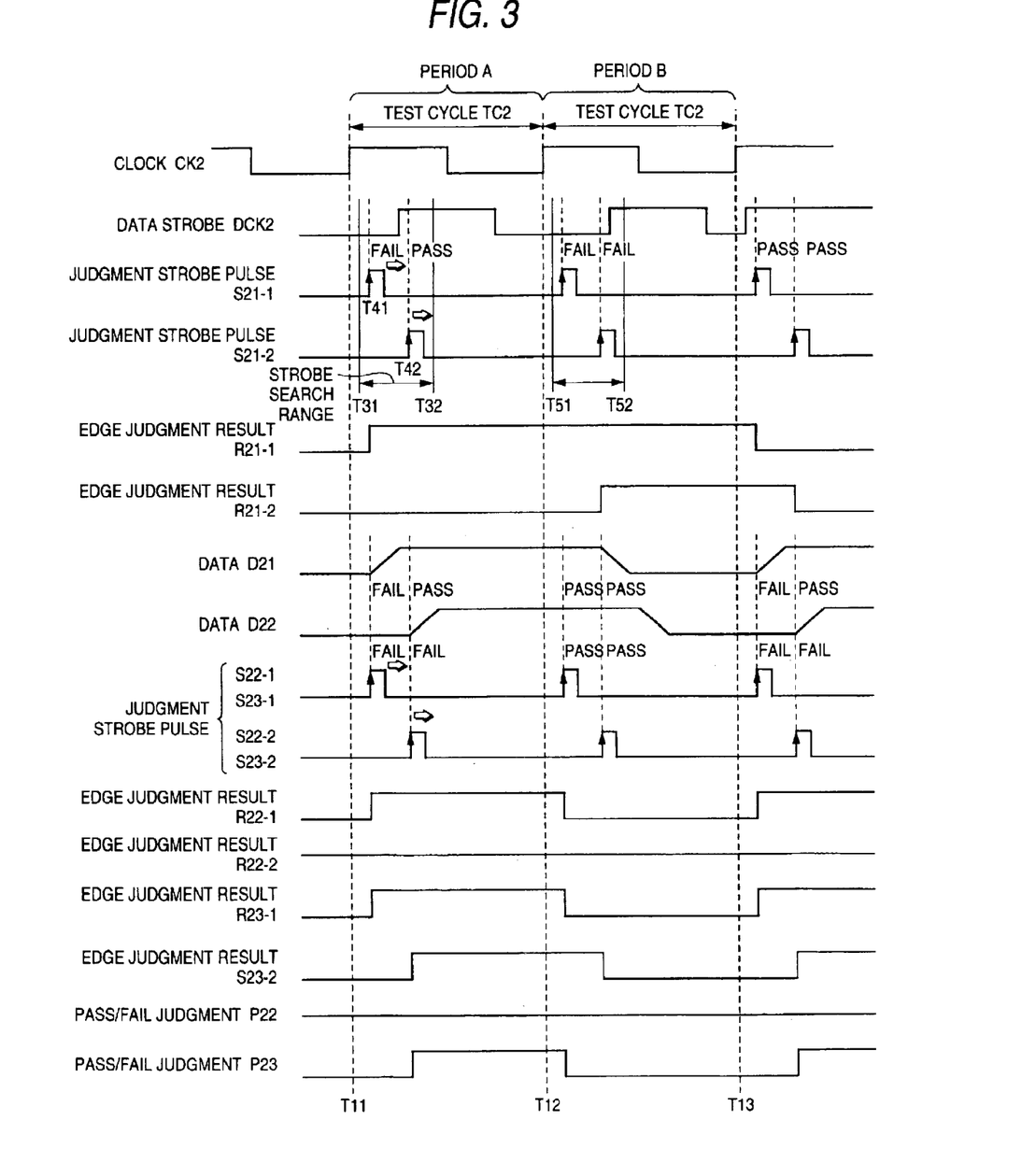
FIG. 3 is a timing chart showing the operation of the IC measuring device (A2) according to the embodiment of the present invention.

FIG. 3 is a timing chart showing the operation of the IC measuring device (A2) in this embodiment. When the IC measuring device (A2) sends a clock (CK2) to the IC (B2) to be measured, the IC (B2) to be measured outputs a data strobe (DCK2), data (D21), data (D22), . . . , and data (Dx). The data strobe (DCK2), the data (D21), the data (D22), . . . , and the data (Dx) outputted from the IC (B2) to be measured are supplied to the IC measuring device (A2) again. The timings, at which the leading edges of the data strobe (DCK2), the data (D21), the data (D22), . . . , and the data (Dx) are outputted, vary within the test cycle (TC2).

First, the operation of measuring the timing of the data strobe (DCK2) will be described. The data strobe (DCK2) outputted from the IC (B2) to be measured is fetched to the edge search circuit (E21) of the logic comparator (CMP21) through the voltage comparator (V21) in the IC measuring device (A2).

The timings of the leading edges of the judgment strobe pulses (S21-1 and S21-2) constituting the two systems of judgment strobe pulses (S21) supplied from the timing generator (TG21) to the edge search circuit (E21) are set to time points T41 and T42 respectively within the test cycle (TC2) in a period A. The time difference between the time points T41 and T42 is set within an allowable range (standard) of the timing of the leading edge of the data strobe (DCK2).

Then, the timings of the leading edges of the judgment strobe pulses (S21-1 and S21-2) are shifted slightly from each other every test cycle TC2, while the leading edge of the data strobe (DCK2) is captured between the leading edges of the pair of the judgment strobe pulses (S21-1 and S21-2). The period A shown in FIG. 3 provides a state in which the leading edge of the data strobe (DCK2) has been captured between the leading edges of the pair of the judgment strobe pulses (S21-1 and S21-2) On the other hand, a period B provides a state in which the leading edge of the data strobe (DCK2) has not been captured.

A specific operation of such capturing will be described. The edge search circuit (E21) receives data strobe (DCK2) which is a measuring object, and a pair of judgment strobe pulses (S21-1 and S21-2). Then, if the leading edge of the judgment strobe pulse (S21-1) is detected, the reversal level of the data strobe (DCK2) is sampled with the judgment strobe pulse (S21-1), and outputted as an edge judgment result (R21-1). On the other hand, if the leading edge of the judgment strobe pulse (S21-2) is detected, the reversal level of the data strobe (DCK2) is sampled with the judgment strobe pulse (S21-2), and outputted as an edge judgment result (R21-2).

For example, since the state of the data strobe (DCK2) is L level at the leading edge of the judgment strobe pulse (S21-1) at a time point T41, the edge judgment result (R21-1) becomes H level.

Further, since the state of the data strobe (DCK2) is H level at the leading edge of the judgment strobe pulse (S21-2) at a time point T42, the edge judgment result (R21-2) becomes L level.

The edge search circuit (E21) performs the above-mentioned operation, while shifting the timings for the leading edges of the pair of judgment strobe pulses (S21-1 and S21-2) without changing the time difference between the leading edges of the judgment strobe pulses (S21-1 and S21-2). The edge search circuit (E21) searches timing at which the edge judgment result (R21-1) becomes H level and the edge judgment result (R21-2) becomes L level.

Specifically, when the logic comparator (CMP21) detects the edge judgment results (R21-1 and R21-2), and the edge judgment results (R21-1 and R21-2) become H level and L level respectively, the Pass/Fail judgment (P21) to be supplied to the CPU (C2) is set to Pass (L). Incidentally, in other cases, the Pass/Fail judgment (P21) is set to Fail (H).

The operation of the edge search circuit (E22) receiving the data (D21) is similar to that of the edge search circuit (E21). However, a predetermined relationship depending on the standards of the IC (B2) to be measured is established between the timing of the judgment strobe pulses (S21) supplied to the edge search circuit (E21) and the timing of the judge strobe pulses (S22) supplied to the edge search circuit (E22).

The edge judgment results (R22-1 and R22-2) outputted from the edge search circuit (E22) are supplied to the judgment control circuit (J22). The above-mentioned edge judgment results (R21-1 and R21-2) are also supplied to the judgment control circuit (J22). On the basis of these four inputs, the judgment control circuit (J22) judges whether the timing of the leading edge of the data (D21) with reference to the leading edge of the data strobe (DCK2) is within an allowable range (standard) or not. Then, the judgment control circuit (J22) outputs a Pass/Fail judgment (P22) to the CPU (C2). FIG. 2 shows the relationship between input and output in the judgment control circuit (J22).

As shown in FIG. 2, the Pass/Fail judgment (P22) becomes Pass (L) when the edge judgment result (R21-1) is H, the edge judgment result (R21-2) is L, the edge judgment result (R22-1) is H and the edge judgment result (R22-2) is L.

In the case where both the edge judgment results (R21-1 and R21-2) are H, or in the case where both the edge judgment results (R21-1 and R21-2) are L, the Pass/Fail judgment (P22) becomes Pass (L), though the state in which the data strobe (DCK2) has not been captured appears. However, in such two cases, the above-mentioned Pass/Fail judgment (P21) is Fail (H). Accordingly, the CPU (C2) can recognize the state in which the data strobe (DCK2) has not been captured.

In any case other than the above-mentioned three cases, the Pass/Fail judgment (P22) becomes Fail (H). That is, assume that the case where the edge judgment result (R21-1) is H, the edge judgment result (R21-2) is L, the edge judgment result (R22-1) is H and the edge judgment result (R22-2) is L, is a first case; the case where both the edge judgment results (R21-1 and R21-2) are H is a second case; and the case where both the edge judgment results (R21-1 and R21-2) are L is a third case. Then, in any case other than the first, second and third cases, the Pass/Fail judgment (P22) becomes Fail (H).

Incidentally, the operations in the edge search circuits (E23, E24, . . . , Ex) and the judgment control circuits (J23, J24, . . . , Jx) are similar to those in the edge search circuit (E22) and the judgment control circuit (J22).

Figure 4:
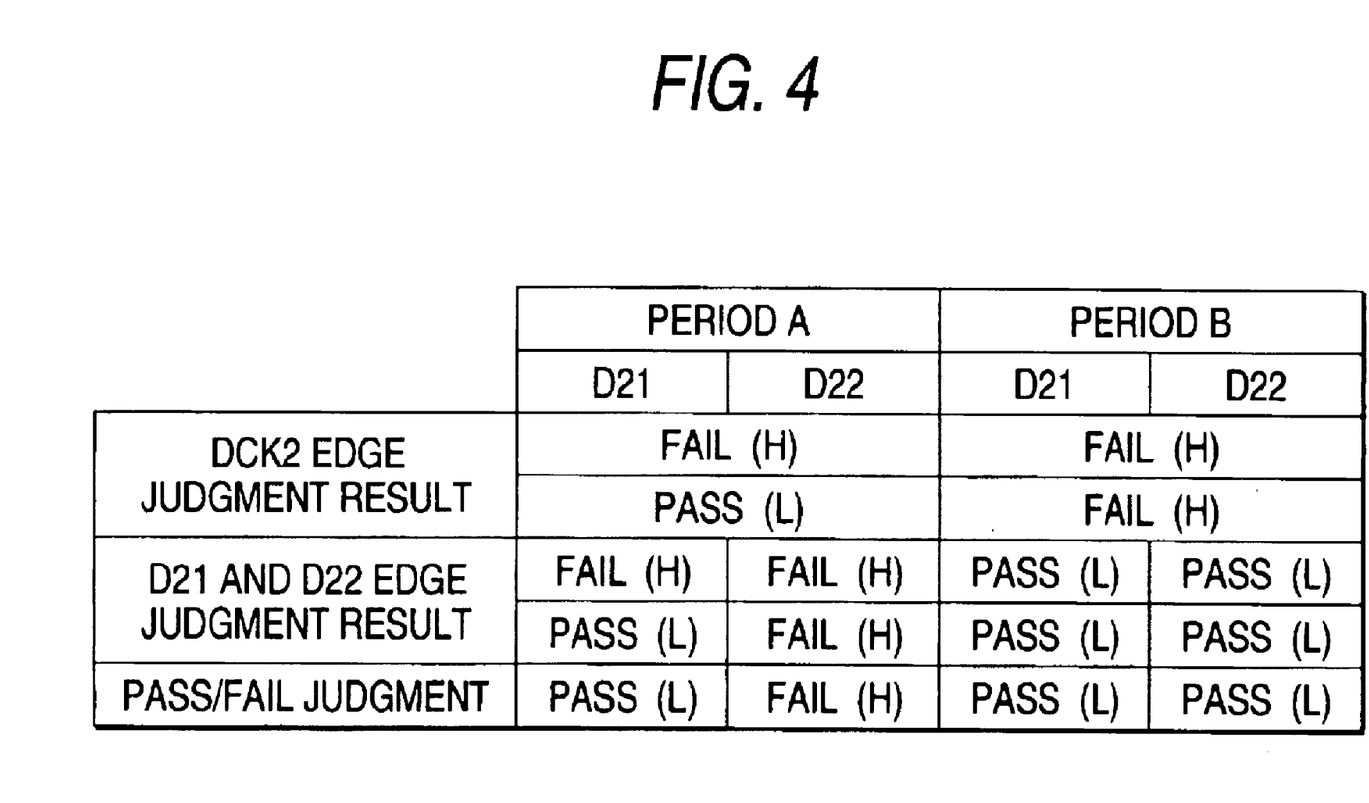
FIG. 4 is a table showing the judgment results of the timings of data (D21 and D22) with reference to a data strobe (DCK2) in periods A and B shown in FIG. 3.

FIG. 4 is a table showing the judgment results of the timings of the data (D21 and D22) with reference to the data strobe (DCK2), that is, the Pass/Fail judgments (P22 and P23), in the periods A and B shown in FIG. 3.

For example, as for the data (D21) in the period A, the Pass/Fail judgment (P22) becomes Pass (L) because the edge judgment result (R21-1) of the data strobe (DCK2) is H, the edge judgment result (R21-2) of the data stroke (DCK2) is L, the edge judgment result (R22-1) of the data (D21) is H, and the edge judgment result (R22-2) of the data (D21) is L.

Further, as for the data (D22) in the period A, the Pass/Fail judgment (P23) becomes Fail (H) because the edge judgment result (R21-1) of the data strobe (DCK2) is H, the edge judgment result (R21-2) of the data stroke (DCK2) is L, the edge judgment result (R23-1) of the data (D22) is H, and the edge judgment result (R23-2) of the data (D22) is H.

According to the above-mentioned operation, judgment is made within one test cycle as to whether the timings of the data (D21, D22, . . . , Dx) with reference to the data strobe (DCK2) are within an allowable range (standard) or not.

Incidentally, timings not with reference to the data strobe (DCK2) but with reference to the judgment strobe pulse (S21-1 or the like) can be also judged. For example, timings with reference to the time point T41 of the leading edge of the judgment strobe pulse (S21-1) can be also judged.

In addition, if the timings of the judgment strobe pulses (S22, S23, . . . , Sx) relative to one another are set to have a predetermined relationship depending on the standards of the IC (B2) to be measured, the timings of the data (D21, D22, . . . , Dx) can be judged simultaneously.

According to the present invention, when the timing of data (a data strobe or data) to be measured which is outputted from an IC (particularly, IC containing the data strobe) to be measured is measured, the states of the measured data at two time points in one test cycle can be detected within a period corresponding to one test cycle. Thus, the timing of the measured data can be measured at a high speed so that the measuring time can be shortened largely.

What is claimed is:

1. An IC measuring device for determining acceptance or rejection of timing between a data strobe outputted from an IC to be measured and data outputted from the IC, the IC measuring device comprising:

a first timing generator for outputting a pair of judgment strobe pulses at different times and in synchronism with a test cycle of the IC measuring device;

a first edge detector for detecting states of the data strobe at two time points within one test cycle on the basis of the pair of judgment strobe pulses supplied by the first timing generator;

a second timing generator for outputting a pair of judgment strobe pulses at different times and in synchronism with a test cycle of the IC measuring device;

a second edge detector for detecting states of the data at two time points within one test cycle on the basis of the pair of judgment strobe pulses supplied by the second timing generator; and a judgment section for determining acceptance or rejection of timing of the data with reference to the data strobe on the basis of the states of the data detected by the second edge detector and the states of the data strobe detected by the first edge detector.

2. The IC measuring device according to claim 1, wherein a time interval between the pair of judgment strobe pulses outputted from the first timing generator and a time interval between the pair of judgment strobe pulses outputted by the second timing generator are set respectively in accordance with standards of the IC to be measured.

3. The IC measuring device according to claim 1, wherein a relationship in accordance with the standards of the IC to be measured is established between timing at which the first timing generator outputs each of the judgment strobe pulses and timing at which the second timing generator outputs corresponding one of the judgment strobe pulses.

4. The IC measuring device according to claim 1, including:

a plurality of circuit blocks each including the second timing generator, the second edge detector and the judgment section.

5. The IC measuring device according to claim 4, wherein a relationship in accordance with the standards of the IC to be measured is established among judgment strobe pulses outputted from the second timing generators included in the circuit blocks.

* * * * *